United States Patent [19]

Shepard et al.

[11] 4,403,394
[45] Sep. 13, 1983

[54] FORMATION OF BIT LINES FOR RAM DEVICE

[75] Inventors: Joseph F. Shepard, Hopewell Junction; Paul J. Tsang, Poughkeepsie, both of N.Y.

[73] Assignee: International Business Machines Corporation, Armonk, N.Y.

[21] Appl. No.: 217,371

[22] Filed: Dec. 17, 1980

[51] Int. Cl.$^3$ ................ H01L 21/22; H01L 21/28
[52] U.S. Cl. .......................... 29/571; 29/576 B; 29/577 C; 29/591; 148/187; 356/67
[58] Field of Search ............ 29/571, 591, 576 B, 29/577 C; 148/187; 356/67

[56] References Cited

U.S. PATENT DOCUMENTS

| | | | |
|---|---|---|---|
| 4,102,714 | 7/1978 | DeBar et al. | 29/571 |
| 4,105,475 | 8/1978 | Jenne | 148/175 |
| 4,194,283 | 3/1980 | Hoffman | 29/571 |
| 4,200,968 | 5/1980 | Schroeder | 29/571 |
| 4,251,571 | 2/1981 | Garbarino et al. | 148/187 X |
| 4,264,382 | 4/1981 | Anantha et al. | 29/576 W |
| 4,272,302 | 6/1981 | Jhabvala | 29/571 X |
| 4,317,274 | 3/1982 | Yasunari | 29/571 |
| 4,326,332 | 4/1982 | Kenney | 29/571 |
| 4,327,476 | 5/1982 | Iwai et al. | 29/580 X |
| 4,329,706 | 5/1982 | Crowder et al. | 357/67 X |
| 4,335,505 | 6/1982 | Shibata et al. | 29/571 X |
| 4,341,009 | 7/1982 | Bartholomew et al. | 29/571 |
| 4,343,657 | 8/1982 | Ito et al. | 148/187 X |
| 4,350,536 | 9/1982 | Nakano et al. | 148/187 X |
| 4,356,211 | 10/1982 | Riseman | 29/576 W |
| 4,369,564 | 1/1983 | Hiltpold | 29/580 X |

Primary Examiner—G. Ozaki
Attorney, Agent, or Firm—Frank C. Leach, Jr.; George O. Saile

[57] ABSTRACT

A conductor bit line for a dynamic random access memory (RAM) structure is formed of a material selected from the group consisting of polycrystalline silicon and a metal silicide, polycrystalline silicon and a conductive metal, and polycrystalline silicon, a metal silicide, and a conductive metal with the polycrystalline silicon contacting at least a portion of the drain region of the field effect transistor of each of a plurality of cells of the RAM structure via a self-aligned contact. When the selected material is polycrystalline silicon and a metal silicide, the conductor bit line is continuous. When the selected material is polycrystalline silicon and a conductive metal or polycrystalline silicon, a metal silicide, and a conductive metal, the polycrystalline silicon contacts with each of the drain regions while the conductive metal connects the polycrystalline silicon overlying adjacent drain regions when the selected material is polycrystalline silicon and a conductive metal and connects the metal silicide on the polycrystalline silicon overlying adjacent drain regions when the selected material is polycrystalline silicon, a metal silicide, and a conductive metal.

13 Claims, 29 Drawing Figures

FORMATION OF BIT LINES FOR RAM DEVICE

TECHNICAL FIELD

This invention relates to a method for forming a conductor line with self-aligned contacts and a RAM (random access memory) structure having a conductor bit line with self-aligned contacts and, more particularly, to a method for forming a conductor line with self-aligned contacts in which the conductor line has its material selected from the group consisting of polycrystalline silicon and a metal silicide, polycrystalline silicon and a conductive metal, and polycrystalline silicon, a metal silicide, and a conductive metal and a RAM structure having such a conductor bit line.

BACKGROUND ART

In a one device dynamic RAM structure, the device charge transfer efficiency of each cell of the RAM structure is inversely related to the ratio of the capacitance of the bit line to the storage capacitance of the cell. Thus, the charge transfer efficiency of the cell can be increased through decreasing the capacitance of the bit line and/or increasing the storage capacitance of the cell.

One previous arrangement for forming the bit line has been to diffuse a bit line of one conductivity into a substrate of the opposite conductivity. However, this has produced a PN junction resulting in a relatively large capacitance of the bit line.

One previously suggested means of reducing the relatively large capacitance of the bit line produced by the PN junction is to form the bit line of polycrystalline silicon as set forth in pages 3828–3831 of the February 1979 (Volume 21, No. 9) issue of the IBM Technical Disclosure Bulletin. This requires formation of contact holes to the diffused drain regions, which are to be contacted by the polycrystalline silicon bit line, prior to the polycrystalline silicon bit line being deposited. Thus, to compensate for alignment tolerances, the contact holes must be relatively large in comparison with self-aligned contacts so that there is a substantial junction area between the diffused drain regions and the bit line but the capacitance of the bit line is decreased by the use of the polycrystalline silicon bit line in comparison with the prior diffused bit lines.

While forming the bit line of polycrystalline silicon will reduce the capacitance of the bit line, it also decreases the conductivity of the bit line. Thus, forming the bit line of polycrystalline silicon instead of having a diffused bit line lowers the sheet resistance of the bit line. Therefore, a polycrystalline silicon bit line improves the charge transfer efficiency of a storage cell to some degree because of the reduction in the capacitance of the bit line in comparison with the diffused bit line but lowers the conductivity of the bit line in comparison with the diffused bit line.

One means of improving the conductivity of a polycrystalline silicon conductor line has been to utilize a metal silicide therewith. This is discussed in U.S. Pat. No. 4,180,596 to Crowder et al, pages 5466 and 5467 of the May 1980 (Volume 22, No. 12) issue of the IBM Technical Disclosure Bulletin, and page 1691 of the September 1979 (Volume 22, No. 4) issue of the IBM Technical Disclosure Bulletin. Thus, the capability of increasing the conductivity of a polycrystalline silicon conductor line through the use of a metal silicide has been previously recognized. However, none of these has self-aligned contacts.

The present invention not only produces a reduction in the capacitance of the bit line in comparison with the diffused bit line or the polycrystalline silicon bit line but also reduces the sheet resistance of the bit line. As a result, the cycle time of each of the cells is significantly reduced. Therefore, a cell of a one device dynamic RAM structure can operate faster than those utilizing polycrystalline silicon bit lines.

By reducing the capacitance of the bit lines so that the charge transfer efficiency is increased, the cells of the one device dynamic RAM structure can be made with smaller dimensions and still achieve the same performance as was previously obtained from a cell using the polycrystalline silicon bit line, for example. Accordingly, the present invention enables an increase in the density of the cells on a substrate.

In a prior method for forming a one device RAM structure, a photolithographic etching step has been employed to open contact holes in the layer of silicon dioxide to active regions of the device such as the drain region of the field effect transistor (FET), for example. This has required spaces to be reserved in the structure to compensate for the etch bias and the photolithographic mask overlay alignment tolerance.

With the method of the present invention in which self-aligned contacts are produced, the photolithographic etching step is eliminated so that the reserved spaces for the etch bias and the photolithographic mask overlay alignment tolerance are not needed. Accordingly, this allows a further reduction in the dimensions of the cells to enable a further increase in the density of the cells on a substrate.

SUMMARY OF THE INVENTION

The capacitance of the bit line of the present invention is improved by disposing the bit line on an electrically insulating material and contacting the drain region of a field effect transistor (FET), for example, through a self-aligned contact. This substantially decreases the areas of contact between the bit line and the diffused regions in a substrate to reduce the capacitance of the bit line.

The present invention also improves the capacitance and sheet resistance of the bit line through forming the bit line of a material selected from the group consisting of polycrystalline silicon and a metal silicide, polycrystalline silicon and a conductive metal, and polycrystalline silicon, a metal silicide, and a conductive metal. Each of these materials not only reduces the bit line capacitance but also decreases the resistance of the bit line.

An object of this invention is to provide a method for forming a conductor line with self-aligned contacts for use with a device in a silicon substrate.

Another object of this invention is to provide a method for forming a conductor bit line with a relatively high conductivity and relatively low capacitance.

A further object of this invention is to provide a method for forming a conductor bit line with self-aligned contacts for a one device dynamic RAM structure.

Still another object of this invention is to provide an integrated circuit structure having a conductor bit line of relatively high conductivity with self-aligned contacts for a one device dynamic RAM structure.

A still further object of this invention is to increase the density of the storage cells of a RAM structure.

The foregoing and other objects, features, and advantages of the invention will be apparent from the following more particular description of preferred embodiments of the invention as illustrated in the accompanying drawings.

DETAILED DESCRIPTION OF PREFERRED EMBODIMENTS

Figure 1:
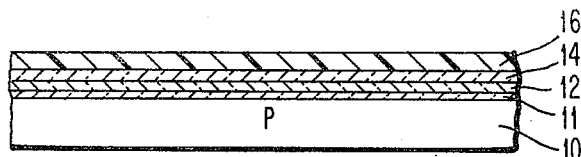
FIGS. 1-18 are fragmentary diagrammatic sectional views of a portion of a substrate showing various stages of formation of a dynamic RAM cell in the substrate with a bit line formed of polycrystalline silicon and molybdenum silicide or tungsten silicide.

Referring to the drawings and particularly FIG. 1, there is shown a substrate 10 of monocrystalline silicon having any orientation. The substrate 10 has silicon dioxide thermally grown thereon to form a layer 11 of silicon dioxide having a thickness in the range of 100 Å to 1,000 Å and preferably a thickness of 400 Å. The substrate 10 is a P conductivity type in the example given herein but may be either type.

Then, a layer 12 of silicon nitride ($Si_3N_4$) is deposited by chemical vapor deposition (CVD) on top of the layer 11 of silicon dioxide. The layer 12 of silicon nitride has a thickness in the range of 500 Å to 2,000 Å and preferably a thickness of approximately 1,000 Å.

Then, a layer 14 of silicon dioxide is deposited on top of the layer 12 of silicon nitride by CVD. The layer 14 of silicon dioxide has a thickness in the range of 500 Å to 2,500 Å and is preferably in the range of 1,000 Å to 1,500 Å.

After the layers 11, 12, and 14 have been deposited to form an oxide nitride stack, which is a layered structure, the layer 14 of silicon dioxide has a layer 16 of photoresist deposited thereover through a blanket coating. The deposited layer 16 of photoresist is subjected to a pattern exposure so that development of the photoresist of the layer 16 forms a photoresist device pattern. The layer 16 of photoresist is not removed in any area in which a device region 17 (see FIGS. 3 and 3A) is to be formed.

With the layer 16 (see FIG. 1) of photoresist remaining over areas of the substrate 10 in which the device regions 17 (see FIGS. 3 and 3A) are to be produced, the layer 14 (see FIG. 1) of silicon dioxide and the layer 12 of silicon nitride are etched in the areas not protected by the remaining portions of the layer 16 of photoresist. This etching may be either a wet etch or a dry etch.

With a wet etch, the portions of the layer 14 of silicon dioxide not protected by the remaining portions of the layer 16 of photoresist are etched by a buffered hydrofluoric acid solution, which may be a 7:1 solution, for example. Then, the remaining portions of the layer 16 of photoresist are stripped by a solvent or an oxygen plasma, for example.

After the remaining portions of the layer 16 of photoresist have been stripped from the remaining portions of the layer 14 of silicon dioxide, the remaining portions of the layer 14 of silicon dioxide function as a mask to enable etching of unprotected portions of the layer 12 of silicon nitride by a solution of phosphoric acid ($H_3PO_4$). This produces the structure shown in FIG. 2 in which the layer 11 of silicon dioxide remains over the entire surface of the monocrystalline silicon substrate 10 while only portions of the layer 12 of silicon nitride and the layer 14 of silicon dioxide remain.

When a dry etch is to be utilized, the substrate 10 is dip etched in a buffered hydrofluoric acid solution, which may be a 7:1 solution, for example, to remove the portions of the layer 14 of silicon dioxide not protected by the remaining portions of the layer 16 of photoresist. The portions of the layer 12 of silicon nitride not protected by the remaining portions of the layer 14 of silicon dioxide are then etched by a plasma of a gas mixture of carbon tetrafluoride ($CF_4$) and oxygen ($O_2$), for example. Then, the remaining portions of the layer 16 of photoresist are stripped from the remaining portions of the layer 14 of silicon dioxide in the same manner as when a wet etch is employed.

Figure 2:
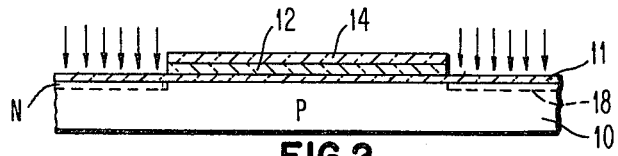

The structure resulting from the dry etch is the same as shown in FIG. 2 for the wet etch. At this time, there is an implantation of boron ions, as indicated by the arrows in FIG. 2, into the substrate 10 in all of the areas not protected by the remaining portions of the layer 12 of silicon nitride. These implanted boron ions form a channel stopper in the substrate 10 of silicon. The level of implantation of the boron ions is indicated by dotted line 18 in FIG. 2. One suitable example of implanting the boron ions is to implant boron ions having a concentration of $5 \times 10^{12}$ ions/$cm^2$ at 100 KeV energy.

Next, recessed isolation oxide (ROX) regions 19 are formed by thermal oxidation in the presence of dry oxygen or steam. Preferably, the recessed isolation oxide regions 19 are formed by thermal oxidation in steam at a temperature of about 900° C. to 1,000° C., preferably 950° C., to a thickness of about 4,000 Å to 10,000 Å, preferably 6,500 Å.

Figure 3:
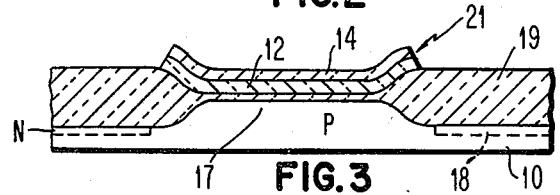
Figure 3A:
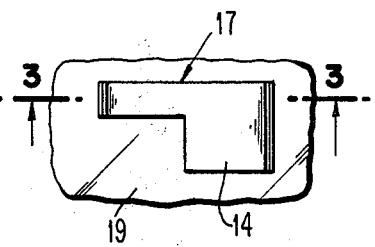
FIGS. 3A, 5A, 9A, 11A, 12A, 13A, and 18A are top plan views corresponding to FIGS. 3, 5, 9, 11, 12, 13, and 18, respectively.

The resulting structure at this stage is shown in FIG. 3. As a result, a plurality of the electrically isolated device regions 17 (one shown in FIG. 3A) is formed by the ROX regions 19. Each of the device regions 17 has the layer 11 of silicon dioxide, the layer 12 of silicon nitride, and the layer 14 of silicon dioxide thereover. Thus, a ROX nitride stack 21, which is a layered structure, remains over each of the defined device regions 17.

Figure 4:
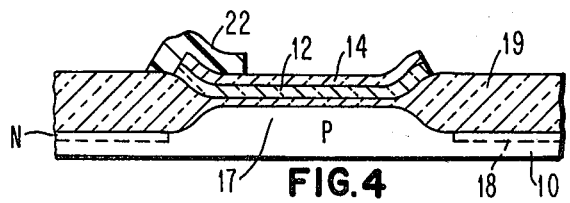

In the same manner as discussed for the layer 16 (see FIG. 1) of photoresist, a layer 22 (see FIG. 4) of photoresist is disposed as a blocking mask over a portion of each of the ROX nitride stacks 21. As shown in FIG. 4, the layer 22 of photoresist covers only an area of the device region 17 where a self-aligned diffusion contact will be formed.

With the layer 22 of photoresist covering only a portion of each of the ROX nitride stacks 21, the remainder of each of the ROX nitride stacks 21 is removed from the substrate 10. The layer 14 of silicon dioxide may be etched in the same manner as previously discussed for etching the layer 14 of silicon dioxide when the layer 16 (see FIG. 1) of photoresist is disposed thereover. Similarly, the layer 12 of silicon nitride may be etched in the same manner as previously discussed for etching the layer 12 of silicon nitride when the layer 16 of photoresist is disposed over the layer 14 of silicon dioxide. Then, the layer 11 of silicon dioxide is dip etched with a buffered hydrofluoric solution, which may be a 7:1 solution, for example.

Figure 5:
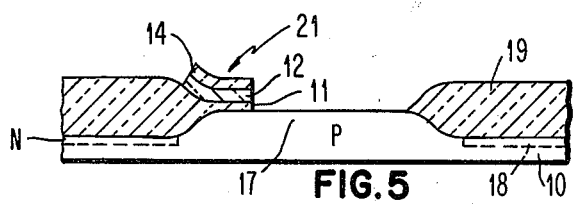

This etch of the layer 11 of silicon dioxide also slightly reduces the thickness of the ROX regions 19 (see FIG. 5). With the ROX regions 19 having a thickness of about 6,500 Å, for example, this dip etching of the layer 11 of silicon dioxide having a thickness of 400 Å, for example, results in removal of approximately 400 Å of the ROX regions 19.

Figure 5A:
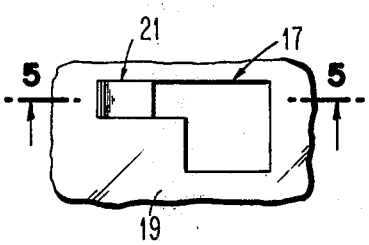

Thereafter, the remaining portions of the layer 22 (see FIG. 4) of photoresist are stripped by any suitable means to produce the structure shown in FIGS. 5 and 5A. Preferably, the remaining portions of the layer 22 of photoresist are removed in the same manner as the remaining portions of the layer 16 (see FIG. 1) of photoresist were removed. Then, the exposed areas of the substrate 10 are cleaned by any suitable cleaning method.

Figure 6:
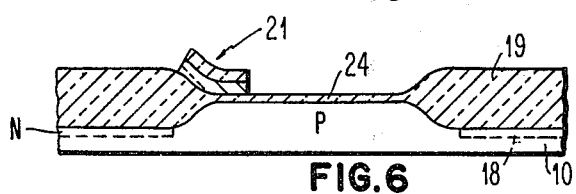

After the exposed areas of the substrate 10 have been cleaned, a thin layer 24 (see FIG. 6) of silicon dioxide is grown on the cleaned areas of the substrate 10. The layer 24 of silicon dioxide is preferably grown in the same manner as the layer 11 (see FIG. 1) of silicon dioxide. The layer 24 (see FIG. 6) of silicon dioxide has a thickness in the range of 200 Å to 1,000 Å and preferably in the range of 250 Å to 500 Å.

At this time, it is preferred that a boron ion implantation be made to adjust the threshold voltage of a gate of an FET, which is to be formed in the device region 17. The boron ions are implanted at a suitable energy such as 80 KeV, for example, with a concentration to provide the desired threshold voltage.

Figure 7:
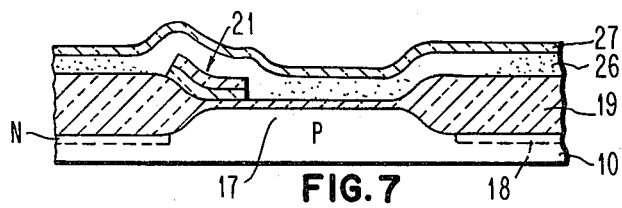

A layer 26 (see FIG. 7) of polycrystalline silicon is next deposited by CVD as a blanket coating over the entire substrate 10. The thickness of the layer 26 of polycrystalline silicon is within the range of 3,000 Å to 5,000 Å and preferably is 4,000 Å.

The layer 26 of polycrystalline silicon is doped to reduce its resistivity by phosphorous or arsenic so that its conductivity is as high as possible. The doping of the layer 26 of polycrystalline silicon with phosphorous can be accomplished by using phosphorous oxychloride (POCl$_3$) in an open tube diffusion. This phosphorous dopant should have a sufficient concentration or dose to reduce the sheet resistivity of the layer 26 of polycrystalline silicon to less than 50 ohms/square.

Next, a thin layer 27 of silicon dioxide is formed on the layer 26 of polycrystalline silicon, preferably by CVD. The layer 27 of silicon dioxide has a thickness in the range of 500 Å to 3,000 Å and is preferably 1,200 Å thick. The layer 27 of silicon dioxide functions as an etch mask in a later etching step of the layer 26 of polycrystalline silicon.

Figure 8:
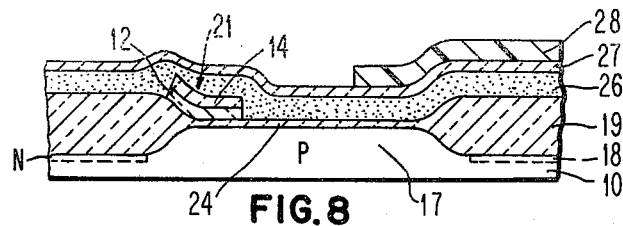

In the same manner as discussed for the layer 16 (see FIG. 1) of photoresist, a layer 28 (see FIG. 8) of photoresist is formed over the area in each of the device regions 17 in which a plate of a storage capacitor is to be formed. The layer 28 of photoresist has a thickness of about one micron.

Next, the layer 27 of silicon dioxide is etched away in the areas in which it is not protected by the remaining portions of the layer 28 of photoresist. This etching may be accomplished by using a buffered hydrofluoric acid solution, which may be a 7:1 solution, for example.

The remaining portions of the layer 28 of photoresist are then stripped. This may be accomplished in the manner previously discussed for removing the remaining portions of the layer 16 (see FIG. 1) of photoresist, for example.

Then, the layer 26 (see FIG. 8) of polycrystalline silicon is removed in any area in which it is not protected by the remaining portions of the layer 27 of silicon dioxide. The layer 26 of polycrystalline silicon is removed by a dry or wet etch. The wet etch may be accomplished by pyrocathechol-ethylene-diamine-water solution, for example. The dry etch may be performed with a plasma of a gas mixture of carbon tetrafluoride (CF$_4$) and oxygen (O$_2$), for example.

Figure 9:
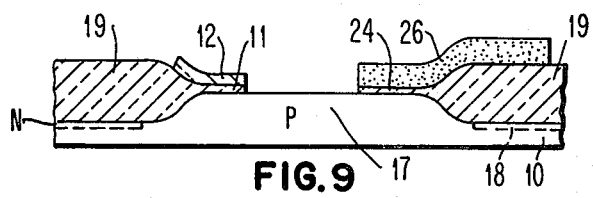
Figure 9A:
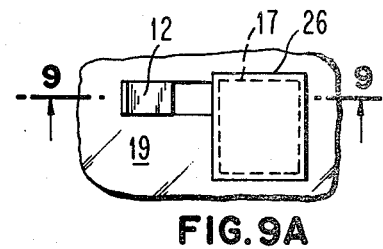

Then, the remaining portions of the layer 27 of silicon dioxide, the remaining portions of the layer 14 of silicon dioxide forming part of the ROX nitride stack 21, and the portions of the layer 24 of silicon dioxide not beneath the remaining portions of the layer 26 of polycrystalline silicon are removed by a buffered hydrofluoric acid solution, which may be a 7:1 solution, for example. This produces the structure of FIG. 9.

Figure 10:
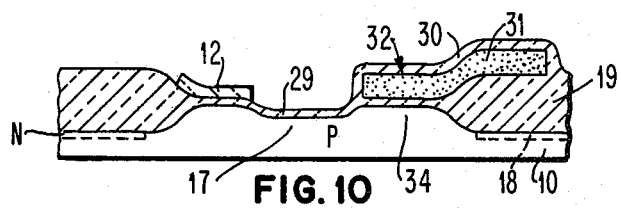

The exposed areas of the surface of the substrate 10 again are cleaned prior to thermally growing a thin layer 29 (see FIG. 10) of silicon dioxide to form a gate oxide for each of the device regions 17. A layer 29 of silicon dioxide is grown to a thickness in the range of 200 Å to 1,000 Å, preferably 250 Å to 500 Å, in the same manner as previously described for the layer 11 (see FIG. 1) of silicon dioxide. During the thermal growth of the layer 29 of silicon dioxide, the surfaces of the layer 26 (see FIG. 9) of polycrystalline silicon are oxidized to form a conformal layer 30 (see FIG. 10) of silicon dioxide. The layer 30 of silicon dioxide has a thickness in the range of 200 Å to 1,000 Å.

If necessary, an implant of boron ions is next made to provide a threshold voltage adjustment for each of the device regions 17. This implant may be used in place of the ion implant prior to the deposit of the layer 26 (see FIG. 9) of polycrystalline silicon or as a supplement thereto. One suitable example for implanting the boron ions is the same as described for implanting boron ions prior to the deposit of the layer 26 of polycrystalline silicon.

Each of the remaining portions of the layer 26 of polycrystalline silicon forms a plate 31 (see FIG. 10) of a capacitor 32 of a storage cell. Each of the storage cells is surrounded by the ROX regions 19 so as to be electrically isolated from each other. When a potential is applied to the plate 31, an area of the substrate 10 beneath the plate 31 has an inversion to form a source region 34 of a field effect transistor (FET) of the storage cell.

Figure 11:
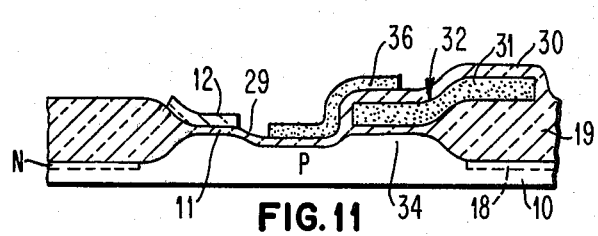
Figure 11A:
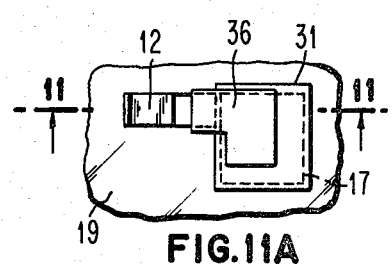

Next, a gate electrode 36 (see FIGS. 11 and 11A) of the FET is formed of polycrystalline silicon having a thickness in the range of 3,000 Å to 5,000 Å. The gate electrode 36 is formed in the same manner as shown and described relative to FIGS. 7, 8, and 9 for forming the plate 31 of the capacitor 32. That is, a layer of polycrystalline silicon is deposited with a layer of silicon dioxide deposited over the layer of polycrystalline silicon by CVD. Next, a photoresist pattern is formed over the layer of silicon dioxide in each of the areas in which one of the gate electrodes 36 is to be formed. Then, the layer of silicon dioxide is etched from any area except where the photoresist is present. Thereafter, the photoresist is stripped. Next, the layer of silicon dioxide, which is on top of the gate electrode 36, is removed as previously described.

An N+ drain region 37 (see FIG. 12) of each of the FETs is then formed in the silicon substrate 10 by ion implantation of arsenic ions having a concentration or dose of about $0.5-1 \times 10^{16}$ ions/cm$^2$ and 50-200 KeV energy. This forms the drain region 37 of the opposite conductivity to the silicon substrate 10.

By controlling the energy, the ions do not penetrate through either the plate 31 or the gate electrode 36. However, the ions have sufficient energy to pass through the remaining portions of the layer 12 of silicon nitride and the layer 11 of silicon dioxide and through the layer 29 of silicon dioxide.

Instead of using ion implantation to form the N+ drain regions 37, an open tube diffusion may be employed. This would utilize phosphorous oxychloride ($POCl_3$).

Figure 12:
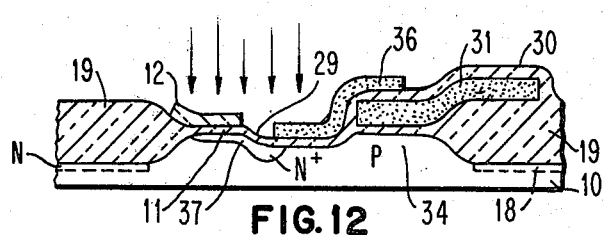
Figure 12A:
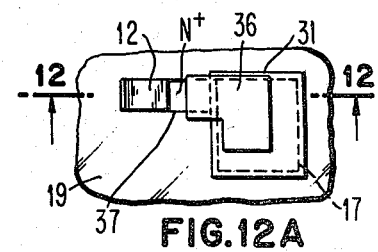

After formation of each of the N+ drain regions 37, a thick layer 38 (see FIG. 13) of silicon dioxide is formed over the gate electrodes 36 of polycrystalline silicon and the exposed portions of the layer 29 of silicon dioxide. This reduces the thickness of each of the gate electrodes 36 to a range of 1,500 Å to 4,750 Å depending on the thickness of the layer 38 of silicon dioxide. Because of the presence of the remaining portions of the layer 12 of silicon nitride over a portion of each of the N+ drain regions 37 as shown in FIG. 12, no oxide is grown thereover because silicon nitride is an oxidation barrier. Because of the thickness of the ROX regions 19, only a very small additional thickness of silicon dioxide is grown thereon.

The layer 38 (see FIG. 13) of silicon dioxide is preferably formed by thermally growing the silicon dioxide to a thickness in the range of 500 Å to 3,000 Å. The layer 38 of silicon dioxide is preferably grown in the same manner as the layer 11 (see FIG. 1) of silicon dioxide.

After formation of the layer 38 (see FIG. 13) of silicon dioxide, the remaining portions of the layer 12 of silicon nitride are removed by a wet or dry etch.

Wet etching of the layer 12 of silicon nitride may be accomplished by a hot phosphoric acid ($H_3PO_4$) at 165° C., for example. The dry etch of the layer 12 of silicon nitride may be by a plasma of a gas mixture of carbon tetrafluoride ($CF_4$) and oxygen ($O_2$), for example.

Figure 13:
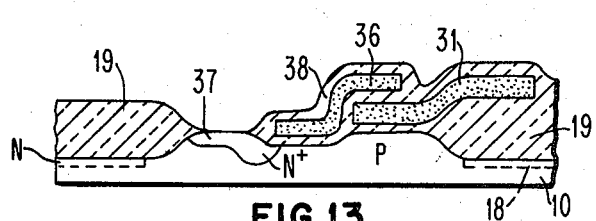
Figure 13A:
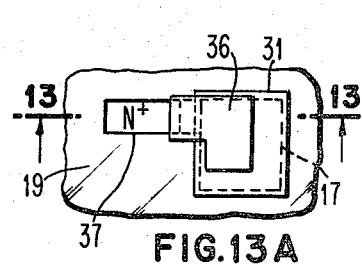

After the remaining portions of the layer 12 of silicon nitride are removed by etching, the substrate 10 is dipped in a buffered hydrofluoric acid solution, which may be a 7:1 solution, for example. This dipping is for a sufficient period of time to remove the layer 11 of silicon dioxide that was beneath the previously removed layer 12 of silicon nitride. This removal of the layer 11 of silicon dioxide exposes a portion of each of the drain regions 37 as shown in FIG. 13.

Then, a layer 40 (see FIG. 14) of polycrystalline silicon is deposited by CVD as a blanket coating over the substrate 10. The thickness of the layer 40 of polycrystalline silicon is within the range of 1,000 Å to 2,000 Å. The layer 40 of polycrystalline silicon is doped in the same manner as the layer 26 (see FIG. 7) of polycrystalline silicon was doped.

A layer 41 (see FIG. 14) of metal silicide is next deposited over the layer 40 of polycrystalline silicon by vacuum evaporation simultaneously of silicon and a metal, which may be molybdenum or tungsten, for example. Thus, the layer 41 of metal silicide is molybdenum silicide or tungsten silicide. The layer 41 of metal silicide preferably has a thickness in the range of 1,500 Å to 3,500 Å. If desired, the layer 41 of metal silicide may be formed by CVD or sputter depositing.

Then, a layer 42 of intrinsic polycrystalline silicon is deposited as a blanket coating over the layer 41 of metal silicide. The layer 42 of polycrystalline silicon is preferably deposited by vacuum evaporation. The thickness of the layer 42 of polycrystalline silicon is within the range of 300 Å to 1,000 Å.

After the layer 42 of polycrystalline silicon has been deposited, a layer 43 of silicon dioxide is deposited as a blanket coating over the layer 42 of polycrystalline silicon. The layer 43 of silicon dioxide is deposited by CVD, plasma or sputtering and preferably has a thickness in the range of 500 Å to 2,000 Å.

Figure 14:
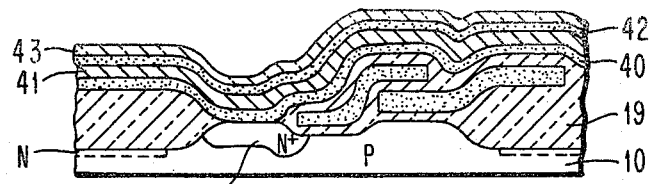

After deposit of the layer 43 of silicon dioxide, the substrate 10 is annealed at an elevated temperature such as 1,000° C., for example, in an inert gas atmosphere, which may be argon or nitrogen, for example. This annealing is for at least thirty minutes to homogenize the silicon in the layer 41 of metal silicide. During this annealing step, part of the N+ dopant in the layer 40 of polycrystalline silicon is driven into the drain region 37 to form the self-aligned buried contact diffusion to make a better contact. This also increases the depth of the drain region 37 as shown in FIG. 14.

Figure 15:
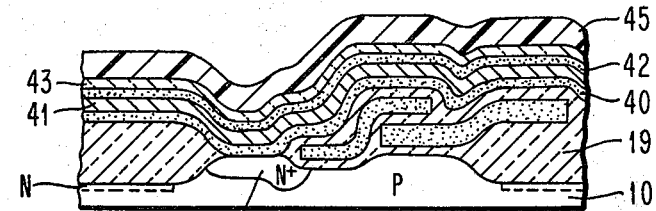

Then, a layer 45 (see FIG. 15) of photoresist is deposited over the layer 43 of silicon dioxide through a blanket coating. The deposited layer 45 of photoresist is subjected to a pattern exposure so that the development of the layer 45 of photoresist forms the desired bit line pattern. This bit line pattern is reproduced in the layer 43 of silicon dioxide by etching the layer 43 of silicon dioxide by either the use of a buffered hydrofluoric acid solution, which may be a 7:1 solution, for example, or by reactive ion etching (RIE). After formation of the bit line pattern in the layer 43 of silicon dioxide, the remaining portions of the layer 45 of photoresist are stripped by a solvent or oxygen plasma, for example.

Figure 16:
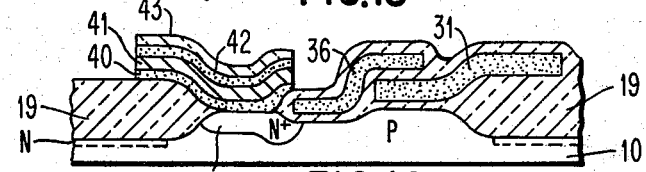

With the remaining portions of the layer 43 of silicon dioxide as a mask, the layer 42 of polycrystalline silicon, the layer 41 of metal silicide, and the layer 40 of polycrystalline silicon are etched, for example, in a single step in a plasma of a gas mixture of carbon tetrafluoride ($CF_4$) and oxygen ($O_2$). This produces the structure of FIG. 16. The remaining portions of the layer 42 of polycrystalline silicon are then converted to silicon dioxide through a high temperature thermal oxidation. For example, this may occur at 1,000° C. in dry oxygen or steam.

Figure 17:
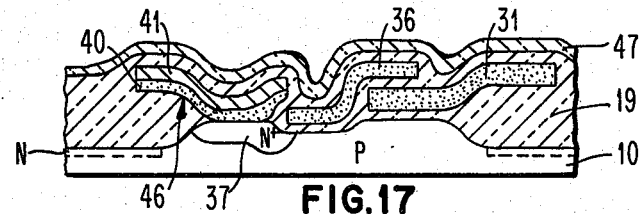

After the remaining portions of the layer 42 of polycrystalline silicon have been converted to silicon dioxide, only the remaining portions of the layer 40 of polycrystalline silicon and the layer 41 of metal silicide are present. These form a bit line 46 as shown in FIG. 17.

After completion of the oxidation step in which the remaining portions of the layer 42 of polycrystalline silicon are converted to silicon dioxide to cover the remaining portions of the layer 41 of metal silicide functioning as part of the bit line 46, a layer 47 of passivating silicon dioxide is deposited, preferably by CVD, as a blanket coating. The thickness of the layer 47 of silicon dioxide is in the range of 2,000 Å to 5,000 Å.

Figure 18:
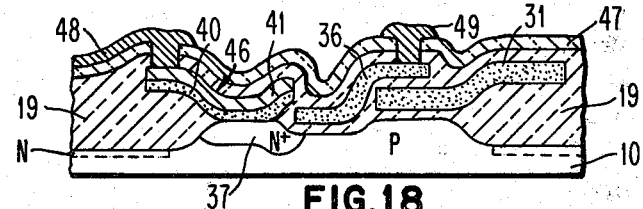
Figure 18A:
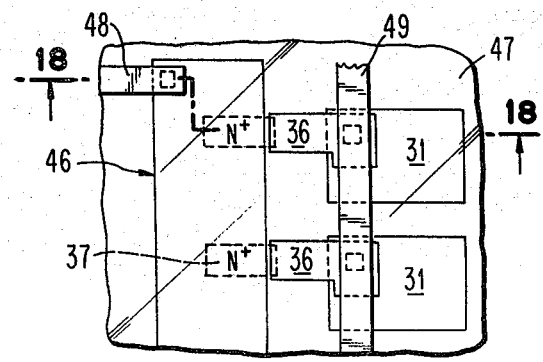

By a blanket evaporation, for example, a conductive metal such as aluminum, for example, is deposited over the layer 47 of silicon dioxide after via holes have been formed at the appropriate locations. With the use of a photoresist mask, the deposited metal is etched by a suitable etchant such as a mixture of phosphoric acid and nitric acid, for example. This produces a metal line 48 of aluminum, for example, for contacting the bit line 46 and a metal line 49, which is a word line and formed of aluminum, for example, for contact with the gate electrode 36 of each of the FETs. After removal of the photoresist mask, the resulting structure is shown in FIGS. 18 and 18A.

Instead of forming the layer 47 (see FIG. 17) of silicon dioxide, it can be formed of silicon nitride, for example. If the layer 47 is formed of silicon nitride, it can be deposited as a plasma silicon nitride. Additionally, the layer 47 could be deposited by sputtering when formed of silicon dioxide.

If the substrate 10 is not subjected to temperatures higher than approximately 800° C. after the layer 41 of metal silicide is deposited, then the metal silicide could be formed of platinum silicide or palladium silicide. This would require different processing steps after the deposition of the layer 40 of polycrystalline silicon.

Figure 19:
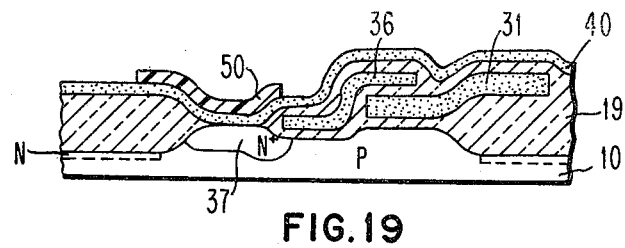
FIGS. 19-21 are fragmentary diagrammatic sectional views of a portion of a substrate showing the different steps for forming the bit line of polycrystalline silicon and platinum silicide or palladium silicide.

When the metal silicide is formed of platinum silicide or palladium silicide, the layer 40 of polycrystalline silicon has the pattern for the bit line 46 etched in the layer 40 of polycrystalline silicon after it has been deposited. This etching of the layer 40 of polycrystalline silicon can be accomplished through depositing a layer 50 (see FIG. 19) of photoresist as a blanket coating.

Then, the layer 40 of photoresist is subjected to a pattern exposure so that development thereof forms the pattern of the bit line 46 (see FIG. 17). The layer 50 (see FIG. 19) of photoresist is not removed in any area in which the bit line 46 (see FIG. 17) is to be formed.

With the layer 50 (see FIG. 19) of photoresist remaining only in the areas in which the pattern of the bit line 46 (see FIG. 17) is to be produced, the layer 40 (see FIG. 19) of polycrystalline silicon is etched by a dry or wet etch in the same manner as the layer 26 (see FIG. 8) of polycrystalline silicon has been etched. After the layer 40 (see FIG. 19) of polycrystalline silicon has been etched, the remaining portions of the layer 50 of photoresist are stripped by a solvent or oxygen plasma, for example.

Figure 20:
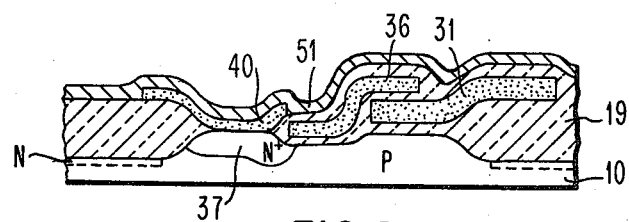

Then, a layer 51 (see FIG. 20) of platinum or palladium is deposited as a blanket coating in an inert gas or hydrogen. By heating to a temperature in the range of 500° C. to 600° C., the portions of the layer 51 of platinum or palladium contacting the remaining portions of the layer 40 of polycrystalline silicon react therewith to form platinum silicide (PtSi) or palladium silicide (Pd$_2$Si).

Figure 21:
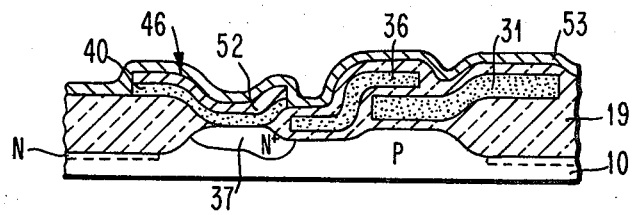

Then, the layer 51 of platinum or palladium has its portions, which were not in contact with the remaining portions of the layer 40 of polycrystalline silicon so as to react therewith, dissolved by a suitable acid solution such as a potassium iodide (KI) acid solution or an aqua regia solution, for example. This leaves a layer 52 (see FIG. 21) of platinum silicide or palladium silicide in contact with the remaining portions of the layer 40 of polycrystalline silicon to form the bit line 46.

Then, a passivating layer 53 of silicon dioxide is deposited over the substrate 10 by CVD or plasma or sputtering. The layer 53 of silicon dioxide has a thickness in the range of 2,000 Å to 5,000 Å.

Figure 22:
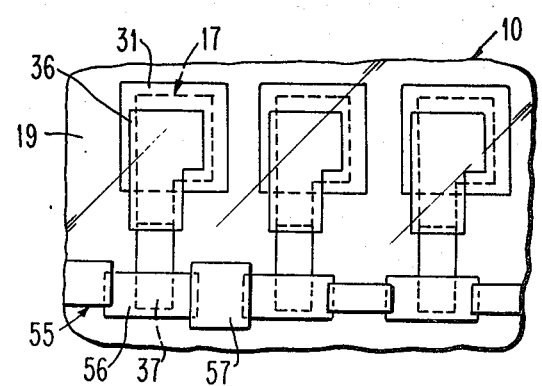
FIG. 22 is a fragmentary top plan view of a portion of a bit line formed of at least polycrystalline silicon and a conductive metal.

Instead of forming the bit line 46 (see FIG. 17) of the remaining portions of the layer 40 of polycrystalline silicon and the layer 41 or 52 (see FIG. 19) of metal silicide, the bit line 46 may be replaced by a bit line 55 (see FIG. 22). The bit line 55 may be formed of segments 56 of polycrystalline silicon and overlapping segments 57 of a conductive metal such as aluminum, for example, overlapping the segments 56 of polycrystalline silicon. Thus, the bit line 55 is a staggered configuration of the segments 56 of polycrystalline silicon and the segments 57 of metal.

In this arrangement, each of the segments 56 is in contact with one of the N+ drain regions 37 and overlaps it sufficiently to have good electrical contact therewith. As long as each of the segments 57 of metal electrically connects the adjacent segments 56 of polycrystalline silicon to each other, it is not necessary for the widths of the segments 57 of conductive metal to be the same or for the segments 57 of metal to be in alignment with each other. It is only necessary that there be a sufficient conducting area between each of the segments 56 of polycrystalline silicon and the two overlapping segments 57 of conductive metal and that each of the segments 56 of polycrystalline silicon has a contact area with the N+ drain region 37 therebeneath.

The formation of the segments 56 of polycrystalline silicon is through etching a layer of polycrystalline silicon after it has been deposited through the use of a photoresist mask in a manner similar to that described for forming portions of the layer 40 (see FIG. 20) of polycrystalline silicon to react with portions of the layer 51 of platinum or palladium during formation of the layer 52 (see FIG. 21) of platinum silicide or palladium silicide. After the segments 56 (see FIG. 22) of polycrystalline silicon have been formed, a layer of aluminum is deposited by a blanket evaporation. Then, by the use of a photoresist mask formed in a manner similar to that for forming the segments 56 of polycrystalline silicon, the layer of aluminum is etched by a suitable etchant such as a mixture of phosphoric acid and nitric acid, for example, to form the segments 57 of metal.

Then, the entire substrate 10 is coated with a passivating layer of silicon dioxide. The layer of silicon dioxide may be deposited by CVD or plasma or sputtering.

If desired, the segments 56 may be formed of both a layer of polycrystalline silicon and a layer of metal silicide with the segments 57 of metal electrically contacting the layer of metal silicide of each of the segments 56. The layer of metal silicide would be placed on top of the layer of polycrystalline silicon in the same manner as described for forming the layer 41 (see FIG. 16) of molybdenum silicide or tungsten silicide or the layer 52 (see FIG. 21) of platinum silicide or palladium silicide.

When the passivating layer 47 (see FIG. 17) of silicon dioxide is deposited at a low temperature such as by sputtering or the layer 47 of silicon dioxide is replaced by silicon nitride deposited as a plasma silicon nitride, for example, then the layer 41 or 52 (see FIG. 21) of metal silicide could be replaced by a conductive metal such as aluminum, for example. The metal may be applied without the addition of an extra mask.

In this arrangement, the metal would be deposited on top of the portions of the layer 40 of polycrystalline silicon remaining from the formation of the bit line 46 in the manner previously described when the layer 52 is formed of platinum silicide or palladium silicide. The aluminum would be deposited in the same manner as previously described for depositing the segments 57 (see FIG. 22) of metal.

If desired, both the layer 40 (see FIG. 17) of polycrystalline silicon and the layer 41 or 52 (see FIG. 21) of metal silicide could be replaced by a conductive metal such as aluminum, for example. In this arrangement, the aluminum would be deposited in the same manner as when forming the segments 57 of the bit line 55. The remainder of the steps to etch the aluminum after providing a mask of photoresist thereover and then coating the substrate 10 with the layer 47 (see FIG. 17) of silicon dioxide would complete the structure.

While the present invention has shown and described the bit line 46 or 55 (see FIG. 21) being utilized with the storage cells, it should be understood that this invention could be utilized where there were only FETs, for example. Likewise, this invention also could be used in any integrated circuit structure having other types of devices in which it is desired to have a conductive contact with a portion thereof.

It should be understood that any metal silicide may be employed other than those utilized. Other suitable examples of the metal silicide are tantalum silicide and titanium silicide.

An advantage of this invention is that it reduces the bit line capacity of an integrated circuit structure. Another advantage of this invention is that it increases the device charge transfer efficiency of a plurality of devices on a chip. A further advantage of this invention is that it enables the capacity of memory cells to be increased. Still another advantage of this invention is that the sheet resistance of the bit line is decreased. A still further advantage of this invention is that there is self-alignment between the bit line and the drain diffusion contact. Yet another advantage of this invention is that the cycle time is decreased because the RC time becomes smaller. A yet further advantage of this invention is that the size of the drain region of each of the FETs can be reduced so that the bit line leakage is decreased.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for forming a conductor line for connection through self-aligned contacts to a first portion of each of a plurality of devices on a monocrystalline silicon substrate with the first portion having an opposite conductivity to the conductivity of the substrate including:

providing separated portions of at least a layer of silicon nitride over each of a plurality of separated areas of the substrate with each area to have one of the plurality of the devices formed therein and the first portion of the device to be connected to the conductor line;

forming electrically insulating material on the substrate to electrically isolate each area having one of the separated portions of the layer of silicon nitride to form electrically isolated areas with each area to have one of the plurality of devices therein;

removing the separated portion of the layer of silicon nitride within each of the electrically isolated areas except in a portion in which a self-aligned contact and at least part of the first portion of one of the plurality of the devices are to be formed;

forming additional portions of each of the plurality of devices on the substrate within each of the electrically isolated areas in portions of the area in which the separated portion of the layer of silicon nitride has been removed after removal of the separated portion of the layer of silicon nitride except in the portion of the area in which the self-aligned contact and at least part of the first portion of each of the plurality of the devices are to be formed;

forming the first portion of each of the plurality of devices for connection to the conductor line after the additional portions of the device have been formed;

forming at least part of the first portion of each of the plurality of devices for connection to the conductor line in an area beneath a portion of the remaining portion of the layer of silicon nitride within each of the electrically isolated areas;

removing the remaining portion of the layer of silicon nitride to form the self-aligned contact with at least the part of the first portion of the device in each of the electrically isolated areas after formation of at least the part of the first portion of the device not beneath the remaining portion of the layer of silicon nitride within each of the electrically isolated areas;

and forming the conductor line on the electrically insulating material on the substrate in electrical contact through the self-aligned contact with at least part of the first portion of each of the plurality of devices and of a material selected from the group consisting of polycrystalline silicon and a metal silicide, polycrystalline silicon and a conductive metal, and polycrystalline silicon, a metal silicide, and a conductive metal with the polycrystalline silicon contacting at least part of the first portion of the device.

2. The method according to claim 1 in which each of the plurality of devices is a field effect transistor and the first portion of each of the plurality of devices connected to the conductor line is the drain region.

3. The method according to claim 2 including:

forming one of the additional portions of each of the plurality of devices by disposing a selected area of polycrystalline silicon of opposite conductivity to the conductivity of the substrate over a selected area of a layer of silicon dioxide on the surface of the substrate in areas not having the remaining portion of the layer of silicon nitride within each of the electrically isolated areas so that a source region of each of the field effect transistors in the substrate occurs when a potential is applied to the selected area of polycrystalline silicon of opposite conductivity to the conductivity of the substrate;

and forming another of the additional portions of each of the plurality of devices by forming a gate electrode of each of the field effect transistors adjacent the remaining portion of the layer of silicon nitride within each of the electrically isolated areas by disposing a selected area of polycrystalline silicon of the opposite conductivity to the substrate over a selected area of a thin layer of silicon dioxide.

4. The method according to claim 3 in which the selected area of polycrystalline silicon of opposite conductivity to the conductivity of the substrate is a plate of a storage capacitor so that each of the field effect transistors is part of a dynamic RAM storage cell and the source region also functions as a second plate of the capacitor.

5. The method according to claim 4 in which the separated portions of at least a layer of silicon nitride are provided by:

disposing at least a layer of silicon nitride on a surface of the substrate having the plurality of separated areas;

and removing the layer of silicon nitride except in areas in which each of the plurality of devices is to be formed.

6. The method according to claim 5 including:

disposing a layer of silicon dioxide on the surface of the substrate prior to the layer of silicon nitride;

disposing a layer of silicon dioxide on the layer of silicon nitride after the layer of silicon nitride is disposed to form a stack of layers of silicon dioxide, silicon nitride, and silicon dioxide;

and removing the same portions of each of the layers of silicon dioxide with the same portions of the layer of silicon nitride.

7. The method according to claim 2 including forming the drain region of each of the field effect transistors by ion implantation of a dopant of opposite conductivity to the conductivity of the substrate.

8. The method according to claim 2 including forming the drain region of each of the field effect transistors by open tube diffusion.

9. The method according to claim 2 including:

disposing a separate portion of polycrystalline silicon contacting the drain region of each of a plurality of field effect transistors when the selected material of the conductor line is selected from the group consisting of polycrystalline silicon and a conductive metal and polycrystalline silicon, a metal silicide, and a conductive metal;

and disposing separate segments of the conductive metal to connect adjacent portions of the polycrystalline silicon when the selected material is polycrystalline silicon and a conductive metal and adjacent portions of the polycrystalline silicon and metal silicide when the selected material is polycrystalline silicon, a metal silicide, and a conductive metal.

10. The method according to claim 2 including disposing a continuous strip of polycrystalline silicon and a metal silicide to form the conductor line when the selected material is polycrystalline silicon and a metal silicide.

11. The method according to claim 1 in which the separated portions of at least a layer of silicon nitride are provided by:

disposing at least a layer of silicon nitride on a surface of the substrate having the plurality of separated areas;

and removing the layer of silicon nitride except in areas in which each of the plurality of devices is to be formed.

12. The method according to claim 11 including:

disposing a layer of silicon dioxide on the surface of the substrate prior to the layer of silicon nitride;

disposing a layer of silicon dioxide on the layer of silicon nitride after the layer of silicon nitride is disposed to form a stack of layers of silicon dioxide, silicon nitride, and silicon dioxide;

and removing the same portions of each of the layers of silicon dioxide with the same portions of the layer of silicon nitride.

13. The method according to claim 12 including forming recessed oxide regions to form the electrically isolated areas of the substrate with each area having a remaining portion of the stack of layers of silicon dioxide, silicon nitride, and silicon dioxide therein.

* * * * *